(12) United States Patent
Derie et al.

(10) Patent No.: US 6,203,625 B1
(45) Date of Patent: Mar. 20, 2001

(54) METHOD OF CLEANING OF A POLYMER CONTAINING ALUMINUM ON A SILICON WAFER

(75) Inventors: Michel Derie, Aix en Provence; Didier Severac, Rousset, both of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/208,664

(22) Filed: Dec. 10, 1998

(30) Foreign Application Priority Data

Dec. 12, 1997 (FR) .................................................. 97 16041

(51) Int. Cl.[7] .................................................. C23G 1/02
(52) U.S. Cl. .................................. 134/3; 134/21; 134/28; 134/33
(58) Field of Search .................................. 134/3, 21, 33, 134/28

(56) References Cited

U.S. PATENT DOCUMENTS

| | | | |
|---|---|---|---|
| 5,238,500 | * 8/1993 | Bergman | 134/3 |
| 5,303,671 | 4/1994 | Kondo et al. | 118/719 |
| 5,357,991 | * 10/1994 | Bergman et al. | 134/102.1 |
| 5,487,398 | 1/1996 | Ohmi et al. | 134/95.1 |
| 5,512,106 | * 4/1996 | Tamai et al. | 134/7 |
| 5,571,367 | 11/1996 | Nakajima et al. | 156/345 |
| 5,666,985 | * 9/1997 | Smith, Jr. et al. | 134/142 |
| 5,678,116 | 10/1997 | Sugimoto et al. | 396/611 |
| 5,698,040 | * 12/1997 | Guldi et al. | 134/1.3 |
| 5,863,348 | * 1/1999 | Smith, Jr. et al. | 134/18 |

FOREIGN PATENT DOCUMENTS

| | | | |
|---|---|---|---|
| 0 753 884 | 1/1997 | (EP) | H01L/21/00 |

OTHER PUBLICATIONS

French Search Report from French Patent Application 97 16041, filed Dec. 12, 1997.

* cited by examiner

*Primary Examiner*—Randy Gulakowski
(74) *Attorney, Agent, or Firm*—Wolf, Greenfield & Sacks, P.C.; James H. Morris; Theodore E. Galanthay

(57) ABSTRACT

The present invention relates to a method of cleaning of a semiconductor wafer covered with silicon oxide, topped with an aluminum layer in which patterns are formed by plasma etching of the aluminum, this etching causing the formation of a polymer containing, in particular, aluminum and carbon on the substantially vertical walls of the patterns, including rotating the wafer in its plane around its axis, in an enclosure under a controlled atmosphere, at ambient temperature, including the following steps rotating the wafer at a speed between 500 and 2000 rpm in an enclosure filled with nitrogen; sprinkling the wafer with water, substantially at the center of the wafer; introducing hydrofluoric acid during a determined cleaning time, while maintaining the sprinkling; and rinsing the wafer by continuing the sprinkling to remove any trace of hydrofluoric acid from the wafer, at the end of the cleaning time.

18 Claims, 1 Drawing Sheet

METHOD OF CLEANING OF A POLYMER CONTAINING ALUMINUM ON A SILICON WAFER

BACKGROUND OF THE INVENTION

1. Field of the Invention

Figure 1:
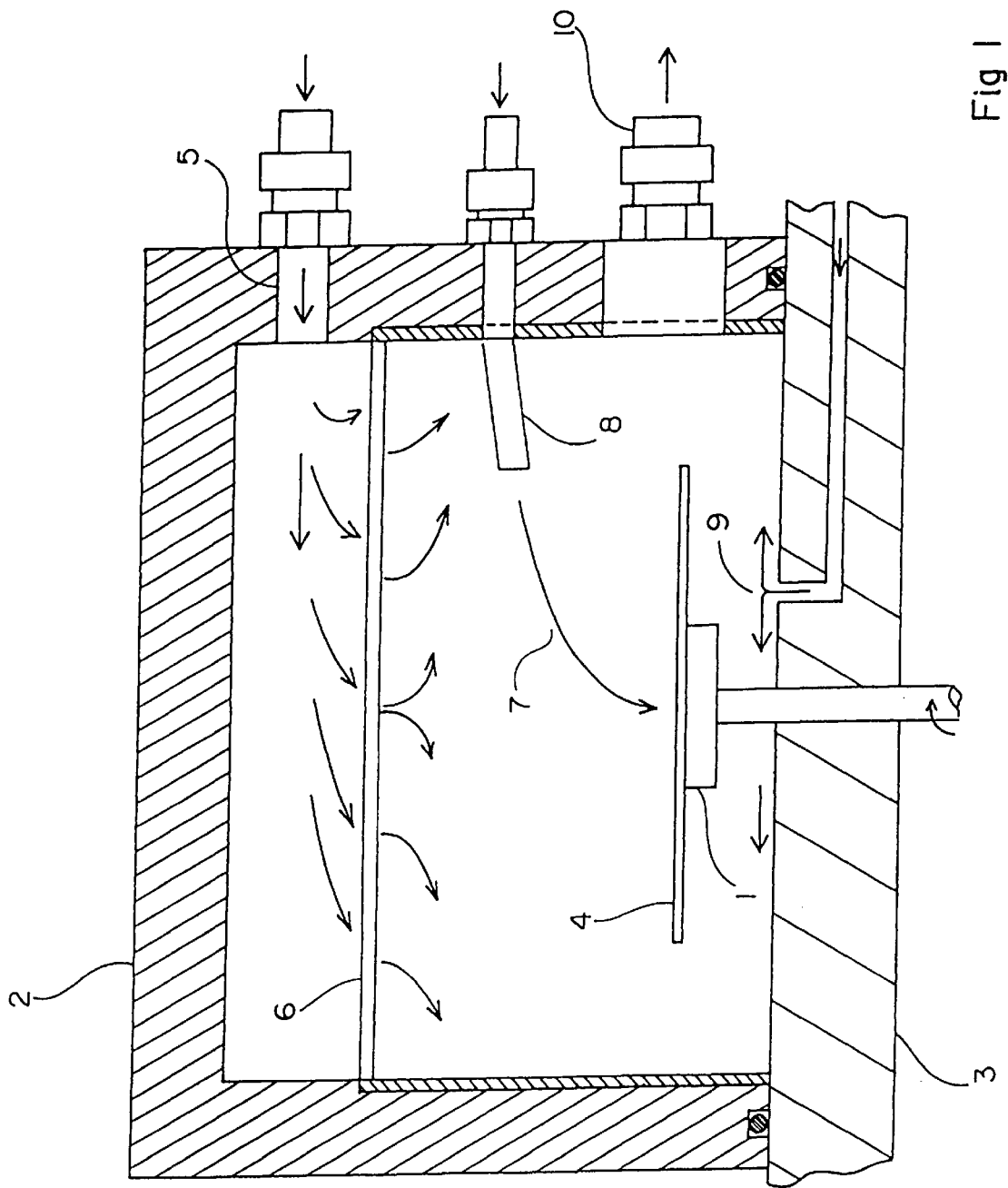

The present invention relates to the cleaning of a semiconductor wafer and more specifically the cleaning of a semiconductor wafer exhibiting, after plasma etching, traces of a residual polymer especially containing aluminum.

2. Discussion of the Related Art

The manufacturing of integrated circuits from silicon wafers requires many steps of etching and implantation of various materials according to some predetermined patterns. A specific step consists of creating, on a silicon oxide surface, patterns formed of aluminum. Silicon oxide is conventionally boron and phosphorus-doped (BPSG). During this step, a uniform aluminum layer is deposited over the entire surface of the silicon oxide, then this aluminum layer is covered with a uniform resist layer on which are formed, by a conventional photolithographic etching method, the patterns that are desired to be reproduced on the aluminum.

The wafer is then submitted to a plasma etching which will etch the aluminum anisotropically in a direction substantially perpendicular to the wafer surface and form the desired patterns in the aluminum. This plasma etching operation consists of digging vertical holes of various cross-sections in the aluminum. At the end of the etching, it can be seen that a thin film especially formed of a polymer including aluminum, boron, chlorine, and carbon, has been deposited on the substantially vertical walls of the hole.

This conductive film is a source of defects and it is desired to eliminate it.

A conventional method to remove the polymer film consists of cleaning the surface of the silicon wafer with a specific solvent, available under denomination EKC.265. This solution has several disadvantages. A cleaning operation using this solvent is relatively long, which represents a significant cost. The solvent used is highly inflammable, and its handling is delicate and costly. Further, the solvent used is likely to harm the environment. It has to be recycled with great precautions, which is long and costly. It is thus desired to avoid using this solvent.

Another cleaning method consists of submitting the wafer to a corrosive atmosphere composed of hydrofluoric acid in gas form and of water vapor for a given time, then rinsing the wafer with water. A disadvantage of this method is that the corrosive atmosphere used to remove the polymer strongly etches the silicon oxide layer located under the aluminum. As a result, the height between the upper surface of the aluminum layer and the upper surface of the oxide layer increases, and the oxide layer may be pierced. Even in the absence of such a piercing, the above-mentioned height increase corresponds to a step height increase for the following layers to be formed, which can create difficulties in following manufacturing steps, for example, during the planarization of a subsequently deposited dielectric layer.

SUMMARY OF THE INVENTION

The present invention provides a method enabling, in an economic, rapid, and reliable manner, removal of the residual polymer film.

The present invention also provides a method of cleaning the residual polymer which does not use any solvent.

The present invention provides a method of cleaning a semiconductor wafer covered with silicon oxide, topped with an aluminum layer in which patterns are formed by plasma etching of the aluminum, this etching causing the formation of a polymer containing, in particular, aluminum and carbon on the substantially vertical walls of the patterns, including rotating the wafer in its plane around its axis, in an enclosure under a controlled atmosphere, at ambient temperature, including the following steps:

rotating the wafer at a speed between 500 and 2000 rpm in an enclosure filled with nitrogen;

sprinkling the wafer with water, substantially at the center of the wafer;

introducing hydrofluoric acid during a determined cleaning time, while maintaining the sprinkling; and rinsing the wafer by continuing the sprinkling to remove any trace of hydrofluoric acid from the wafer, at the end of the cleaning time.

According to an embodiment of the present invention, the hydrofluoric acid is introduced in the enclosure under a pressure close to the atmospheric pressure at a flow rate substantially equal to 20 $cm^3$ per minute.

According to an embodiment of the present invention, the cleaning duration is comprised between 10 and 100 seconds.

According to an embodiment of the present invention, the water is a deionized water and the water is supplied at a rate of approximately 430 $cm^3$ per minute.

According to an embodiment of the present invention, the temperature of the enclosure is substantially 30° C.

According to an embodiment of the present invention, the silicon oxide is boron and phosphorus doped and forms a borophosphosilicate.

The foregoing objects, features and advantages of the present invention will be discussed in detail in the following non-limiting description of specific embodiments in connection with FIG. 1, which shows an example of a device enabling to implement the present invention.

DETAILED DESCRIPTION

FIG. 1 shows a very simplified view of a spinner 1 arranged in an enclosure 2–3. Semiconductor wafer 4 which is desired to be cleaned is laid, substantially centered, on the plate of spinner 1 and maintained on this plate, for example, by suction.

Gaseous hydrofluoric acid dissolved in nitrogen is introduced in enclosure 2–3 by an inlet opening 5, then crosses a porous wall 6 and arrives on semiconductor wafer 4.

A squirt of pure water 7 arrives in enclosure 2–3 on semiconductor wafer 4 through a nozzle 8. The shape of nozzle 8 and the flow rate of water squirt 7 are calculated so that water squirt 7 substantially touches the center of wafer 4.

A gaseous nitrogen flow enters enclosure 2–3 from an opening 9 located under wafer 4. The function of the nitrogen flow mainly is to prevent the hydrofluoric acid diffusing from wall 6 from passing under wafer 4 and etching the lower surface of wafer 4, but it is also used before the beginning of the cleaning to expel out of the enclosure possible residual gases and, after the cleaning, to dry up the wafer.

An outlet nozzle 10 is used to vent the atmosphere of enclosure 2 and to regulate the pressure in the enclosure to approximately two thirds of the atmospheric pressure.

Wafer 4 is covered with a reflowable insulator, such as boron and phosphorus doped silicon oxide (borophosphosilicate or BPSG), topped, in particular, with patterns, each of which is formed of aluminum. These patterns have been obtained by plasma etching and at least one residual polymer especially formed of boron, chlorine, aluminum, and carbon covers the substantially vertical walls of these patterns. Wafer 4 is laid, substantially centered, on the spinner, with its etched surface turned upwards. Once wafer 4 is located on spinner 1, spinner 1 is rotated at a speed between 500 and 2000 rpm while the enclosure is filled with nitrogen to remove any undesirable atmospheric gas. Once the speed of spinner 1 is established and the enclosure is filled with nitrogen, a nitrogen flow being established between opening 9 and outlet nozzle 10, a water squirt 7 is sent substantially to the center of wafer 4. The flow rate of water squirt 7, as well as the shape of nozzle 8 that introduces water squirt 7 into enclosure 2-3 are set not only so that water squirt 7 touches wafer 4 at its center but also so that wafer 4 is substantially uniformly covered with a thin water film. As an example, this water flow rate can correspond to the water supply used conventionally to rinse a semiconductor wafer after a step of etching by corrosive gases.

Once wafer 4 is substantially uniformly covered with a water film, gaseous hydrofluoric acid HF is introduced into enclosure 2-3 through nozzle 5, for example, at a flow rate substantially equal to 20 cm³ per minute for a time comprised between 10 and 100 seconds.

Gaseous hydrofluoric acid is introduced in enclosure 2-3 under a pressure that controls the gas flow rate, slightly higher than the atmospheric pressure.

After having stopped the introduction of gaseous hydrofluoric acid, the wafer is rinsed by being rotated under the water squirt for a time sufficient for any hydrofluoric trace to be removed from the wafer surface.

At the end of the rinsing, the water supply is cut down and the wafer is rotated for a time sufficient for its rinsing. The rotation speed is increased to spin-dry.

All operations can occur at ambient temperature, that is, approximately 30° C.

Measurements have established that according to the present invention, the silicon oxide is only etched across a thickness of approximately 4 nanometers, to be compared with approximately 40 nanometers with the prior method using water in gas form. Such a reduction of the erosion undergone by the silicon oxide substantially decreases the chances of piercing of the oxide layer, and thus increases the reliability of the cleaning process.

The total removal of the residual polymer can be observed on the batch of wafers cleaned according to the present invention.

The present invention thus performs, in a single step, a cleaning of the residual polymers including aluminum appearing upon the plasma etching of an aluminum layer covering a boron and phosphorus doped silicon oxide layer, while substantially decreasing the risks of piercing the silicon oxide layer.

Although the reasons why the present invention results in such an improvement over the prior art cannot be demonstrated with certainty, the present inventors believe that the following hypothesis can be considered.

The chemical reaction between hydrofluoric acid and silicon oxide is a reaction in two steps:

$$SiO_2 + 6HF \leftrightarrow H_2SiF_6 + 2H_2O$$

$$H_2SiF_6 \leftrightarrow SiF_4 + 2HF$$

The first step requires a certain amount of water to be started. Conversely, the presence of excess water in liquid form strongly displaces the chemical equilibrium to the left. Further, the dilution of HF in the liquid water film decreases the HF concentration in the first step, which also slows down the reaction to the resin while enabling a sufficient etching of the residual polymers.

This slowing down of the reaction due to the water saturation can explain that when, according to the present invention, the wafer is covered with water, the etching of the borophosphosilicate by hydrofluoric acid is slower than when the water is only present in gas form.

Finally, the presence of liquid water does not seem to decrease the etching by hydrofluoric acid of the residual polymer film formed of boron, chlorine, aluminum, and carbon and during the cleaning of a wafer according to the present invention; the residual polymer completely disappears.

The present invention has been described in relation to a device that processes a single wafer, but those skilled in the art will easily apply the above descriptions to a device processes several wafers at the same time.

Of course, the present invention is likely to have various alterations, modifications, and improvements which will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of cleaning a semiconductor wafer covered with silicon oxide, topped with an aluminum layer in which patterns are formed by plasma etching of the aluminum, said etching causing the formation of a polymer on the substantially vertical walls of the patterns, including rotating the wafer in its plane around its axis, in an enclosure under a controlled atmosphere, at ambient temperature, including the following steps:

rotating the wafer at a speed between 500 and 2000 rpm in an enclosure filled with nitrogen;

sprinkling the wafer with water in a liquid state directed substantially at the center of the wafer while performing the rotating step;

introducing gaseous hydrofluoric acid during a pre-determined cleaning time, while maintaining the sprinkling and the rotating; and rinsing the wafer by continuing the sprinkling to remove hydrofluoric acid from the wafer, after the pre-determined cleaning time.

2. The method of claim 1, wherein the gaseous hydrofluoric acid is introduced in the enclosure under a pressure close to the atmospheric pressure at a flow rate substantially equal to 20 cm³ per minute.

3. The method of claim 1, wherein the pre-determined cleaning time is between 10 and 100 seconds.

4. The method of claim 1, wherein the water is a deionized water and the water is supplied at a rate of approximately 430 cm³ per minute.

5. The method of claim 1, wherein the temperature of the enclosure is substantially 30° C.

6. The method of claim 1, wherein the silicon oxide is boron and phosphorus doped and forms a borophosphosilicate.

7. The method of claim 6, wherein the introduced gaseous hydrofluoric acid etches the silicon oxide across a thickness of approximately 4 nanometers.

8. The method of claim 1, wherein the step of introducing gaseous hydrofluoric acid is started when the wafer is substantially uniformly covered with a water film.

9. The method of claim 8 further including, after the rinsing step, increasing the rotating speed of the wafer to remove water from its surface.

10. The method of claim 1, wherein the polymer includes aluminum and carbon.

11. A method of cleaning a semiconductor wafer, comprising the acts of:
   providing in an enclosure a semiconductor wafer with one surface at least partially covered with an oxide and a layer in which patterns are formed by plasma etching;
   introducing gaseous nitrogen into the enclosure;
   covering the wafer surface with a substantially uniform film of liquid water by rotating the wafer at a speed between 500 and 2000 rpm and by applying liquid water onto said surface;
   introducing gaseous hydrofluoric acid during a predetermined cleaning time, after said covering with the water film; and
   rinsing the wafer by sprinkling it with water to remove hydrofluoric acid from the wafer, after the predetermined cleaning time.

12. The method of claim 11, wherein the oxide is silicon oxide.

13. The method of claim 12, wherein the introduced gaseous hydrofluoric acid etches the silicon oxide across a thickness of approximately 4 nanometers.

14. The method of claim 11, wherein the layer in which patterns are formed by plasma etching includes aluminum.

15. The method of claim 11, wherein the introducing of the gaseous hydrofluoric acid includes introducing first the gaseous hydrofluoric acid into a volume separated by a porous wall from the wafer, and then allowing the gaseous hydrofluoric acid to diffuse through the porous wall to reach the wafer.

16. The method of claim 15, wherein the introducing of the gaseous nitrogen is performed to control presence of the gaseous hydrofluoric acid in the enclosure near the wafer.

17. The method of claim 11 used for removal of residual polymers formed upon the plasma etching.

18. The method of claim 11, wherein the introduced gaseous hydrofluoric acid etches the silicon oxide across a thickness of approximately 4 nanometers.

* * * * *